US009524958B2

(12) United States Patent
Choi et al.

(10) Patent No.: US 9,524,958 B2
(45) Date of Patent: Dec. 20, 2016

(54) SEMICONDUCTOR DEVICE AND METHOD OF INDIVIDUAL DIE BONDING FOLLOWED BY SIMULTANEOUS MULTIPLE DIE THERMAL COMPRESSION BONDING

(71) Applicant: STATS ChipPAC, Ltd., Singapore (SG)

(72) Inventors: JoonYoung Choi, Gyeonggi-do (KR); YongHee Kang, Kyoungki-Do (KR); HunTeak Lee, Gyeonggi-Do (KR); KeonTaek Kang, Gyeonggi-do (KR); YoungChul Kim, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 60 days.

(21) Appl. No.: 13/928,862

(22) Filed: Jun. 27, 2013

(65) Prior Publication Data

US 2015/0001703 A1 Jan. 1, 2015

(51) Int. Cl.

| | |
|---|---|
| ***H01L 21/76*** | (2006.01) |
| ***H01L 29/24*** | (2006.01) |
| ***H01L 23/48*** | (2006.01) |
| ***H01L 25/00*** | (2006.01) |
| ***H01L 25/065*** | (2006.01) |

(Continued)

(52) U.S. Cl.

CPC ............... *H01L 25/50* (2013.01); *H01L 24/19* (2013.01); *H01L 24/96* (2013.01); *H01L 24/97* (2013.01); *H01L 25/0655* (2013.01); *H01L 21/568* (2013.01); *H01L 2224/12105* (2013.01); *H01L 2224/16225* (2013.01); *H01L 2224/97* (2013.01); *H01L 2924/01322* (2013.01); *H01L 2924/12041* (2013.01); *H01L 2924/12042* (2013.01); *H01L 2924/13091* (2013.01); *H01L 2924/15311* (2013.01); *H01L 2924/181* (2013.01)

(58) Field of Classification Search

CPC ............ H01L 2924/01029; H01L 2924/01079; H01L 2924/01013; H01L 2924/14; H01L 2924/01078; H01L 21/764; H01L 2924/01005; H01L 2924/01015; H01L 23/4822

USPC .......................... 257/734; 438/411, 461, 611

See application file for complete search history.

(56) References Cited

U.S. PATENT DOCUMENTS

| | | | |
|---|---|---|---|
| 6,000,127 | A | 12/1999 | Eifuku et al. |
| 6,998,293 | B2 | 2/2006 | Achari et al. |

(Continued)

*Primary Examiner* — Trung Q Dang

*Assistant Examiner* — Didarul Mazumder

(74) *Attorney, Agent, or Firm* — Robert D. Atkins; Patent Law Group Atkins and Associates, P.C.

(57) ABSTRACT

A semiconductor device includes a carrier with an interface layer applied over the carrier. The interface layer can include non-conductive paste or non-conductive film. A plurality of semiconductor die is mounted to the carrier and interface layer by pressing the semiconductor die to the carrier and interface layer for one second or less, and simultaneously thermal compression bonding multiple semiconductor die to the carrier and interface layer for 5-10 seconds. By pressing the semiconductor die to the interface layer for a short period of time and then simultaneously thermal compression bonding multiple semiconductor die to the interface layer for a second longer period of time, the overall throughput of die bonding increases to process more die per unit of time. An encapsulant is deposited over the semiconductor die. The carrier is removed and interconnect structure is formed over the semiconductor die and encapsulant.

26 Claims, 8 Drawing Sheets

(51) Int. Cl.
*H01L 23/00* (2006.01)
*H01L 21/56* (2006.01)

(56) References Cited

U.S. PATENT DOCUMENTS

| | | | |
|---|---|---|---|
| 7,087,458 B2 | 8/2006 | Wang et al. | |
| 2001/0010945 A1* | 8/2001 | Miyazaki | H01L 21/561 438/107 |
| 2004/0087057 A1* | 5/2004 | Wang et al. | 438/106 |
| 2009/0256266 A1* | 10/2009 | Lao | H01L 23/642 257/774 |
| 2011/0074014 A1* | 3/2011 | Pagaila et al. | 257/737 |
| 2011/0074024 A1* | 3/2011 | Pendse | 257/737 |
| 2011/0193217 A1* | 8/2011 | Meyer-Berg | 257/734 |
| 2011/0278717 A1* | 11/2011 | Pagaila | H01L 21/568 257/737 |
| 2012/0061824 A1* | 3/2012 | Pagaila | H01L 21/568 257/737 |
| 2012/0220082 A1* | 8/2012 | Ng et al. | 438/124 |
| 2012/0319304 A1* | 12/2012 | Pressel | B81B 7/02 257/787 |
| 2013/0113091 A1* | 5/2013 | Meng | H01L 21/561 257/734 |
| 2013/0270230 A1* | 10/2013 | Cheung | H01L 24/75 219/121.6 |
| 2014/0134804 A1* | 5/2014 | Kelly et al. | 438/118 |
| 2014/0167217 A1* | 6/2014 | Hu | H01L 21/76838 257/531 |

* cited by examiner

SEMICONDUCTOR DEVICE AND METHOD OF INDIVIDUAL DIE BONDING FOLLOWED BY SIMULTANEOUS MULTIPLE DIE THERMAL COMPRESSION BONDING

FIELD OF THE INVENTION

The present invention relates in general to semiconductor devices and, more particularly, to a semiconductor device and method of two-step individual die bonding for a short period of time and then simultaneous multiple die thermal compression bonding for a longer period of time.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A plurality of semiconductor die is commonly attached to a carrier using a pick and place operation for encapsulation and formation of interconnect structures. The semiconductor die are individually secured to the carrier using a chuck head under temperature and/or pressure. The chuck head presses a first semiconductor die to the carrier, then presses a second semiconductor die to the carrier, then presses a third semiconductor die to the carrier, and the process continues for each semiconductor die on the carrier. The compression time is typically 5 seconds for each semiconductor die on the carrier. If the carrier contains 36 semiconductor die with an average bonding cycle time of 10 seconds, then the bonding process takes 360 seconds for a die bonding throughput of 360 units per hour (UPH).

SUMMARY OF THE INVENTION

A need exists to increase bonding throughput for securing semiconductor die to a carrier. Accordingly, in one embodiment, the present invention is a method of making a semiconductor device comprising the steps of providing a carrier, applying an interface layer to the carrier, providing a plurality of semiconductor die, and mounting the semiconductor die to the carrier and interface layer by pressing the semiconductor die to the interface layer for one second or less, and simultaneously thermal compression bonding multiple semiconductor die to the interface layer.

In another embodiment, the present invention is a method of making a semiconductor device comprising the steps of providing a carrier, providing a plurality of semiconductor die, and mounting the semiconductor die to the carrier by pressing the semiconductor die to the carrier for a first period of time, and simultaneously thermal compression bonding multiple semiconductor die to the carrier for a second period of time longer than the first period of time.

In another embodiment, the present invention is a method of making a semiconductor device comprising the steps of providing a carrier, providing a plurality of semiconductor die, and mounting the semiconductor die to the carrier by simultaneously thermal compression bonding multiple semiconductor die to the carrier.

In another embodiment, the present invention is a semiconductor device comprising a carrier and plurality of semiconductor die mounted to the carrier by pressing the semiconductor die to the carrier for a first period of time, and simultaneously thermal compression bonding multiple semiconductor die to the carrier for a second period of time longer than the first period of time.

DETAILED DESCRIPTION OF THE DRAWINGS

Figure 1:
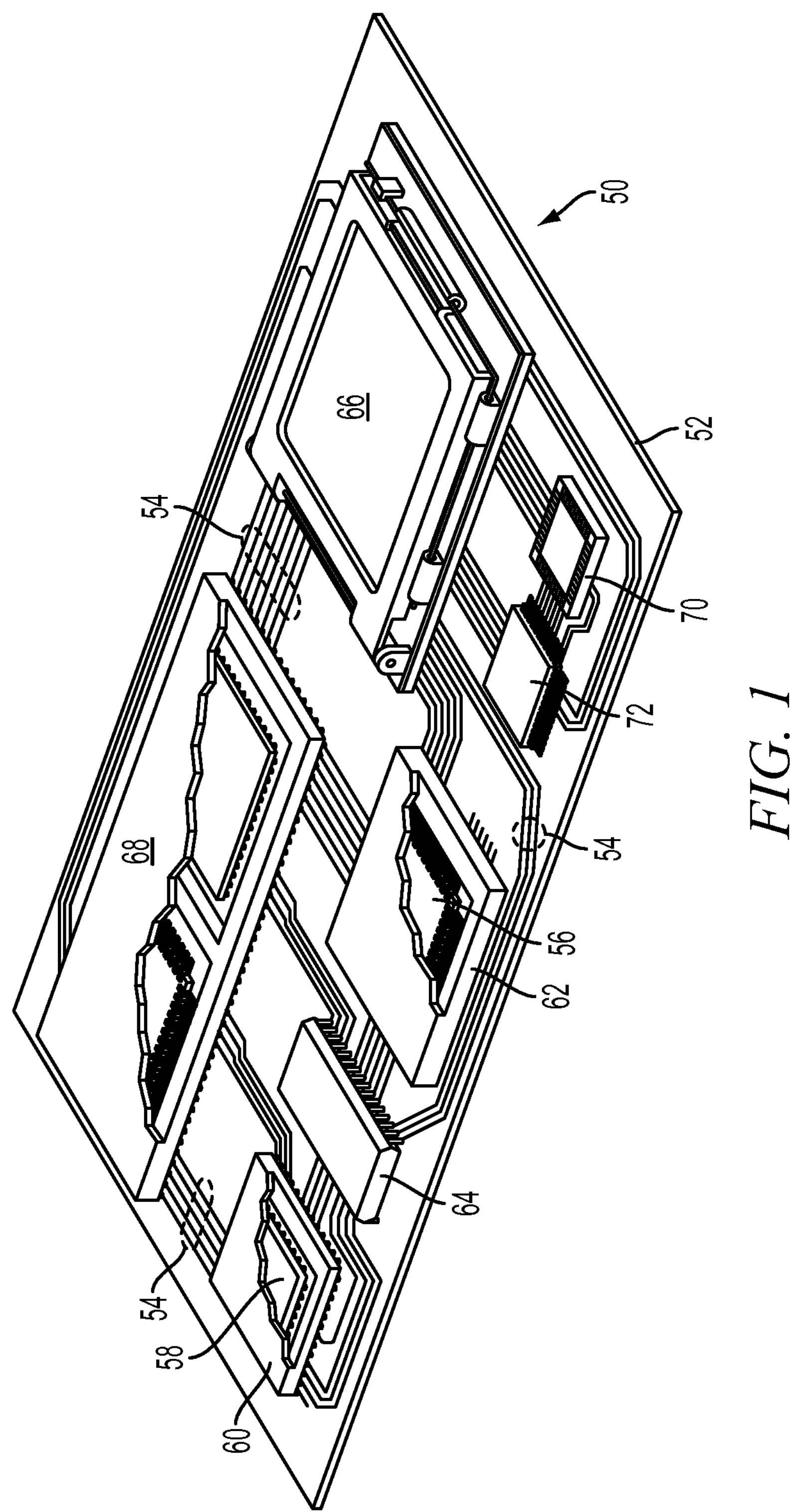
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
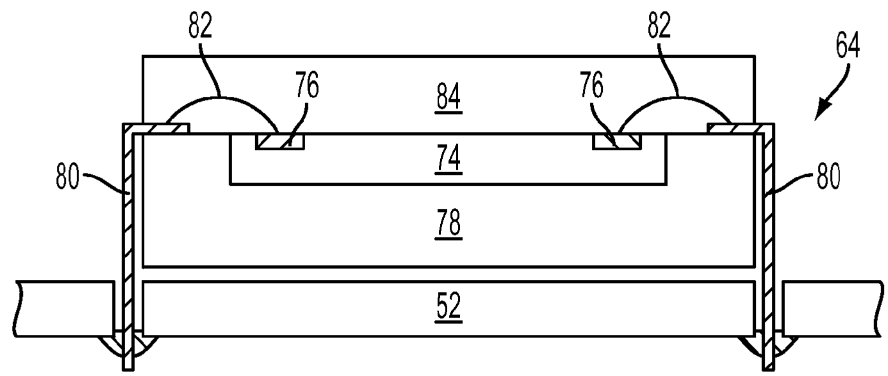
FIGS. 2*a*-2*c* illustrate further detail of the representative semiconductor packages mounted to the PCB.
Figure 2B:
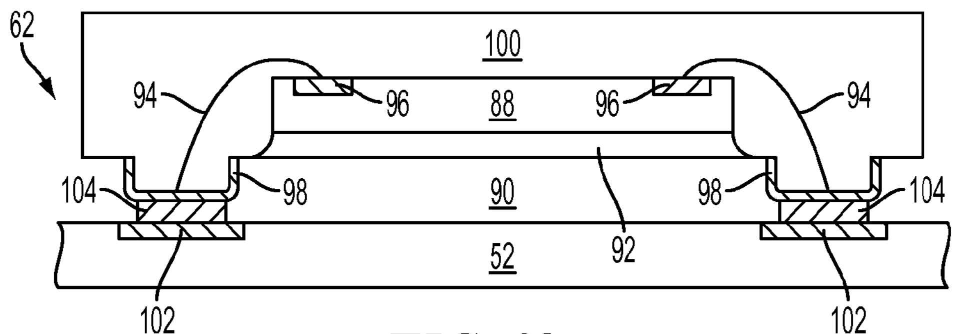
Figure 2C:
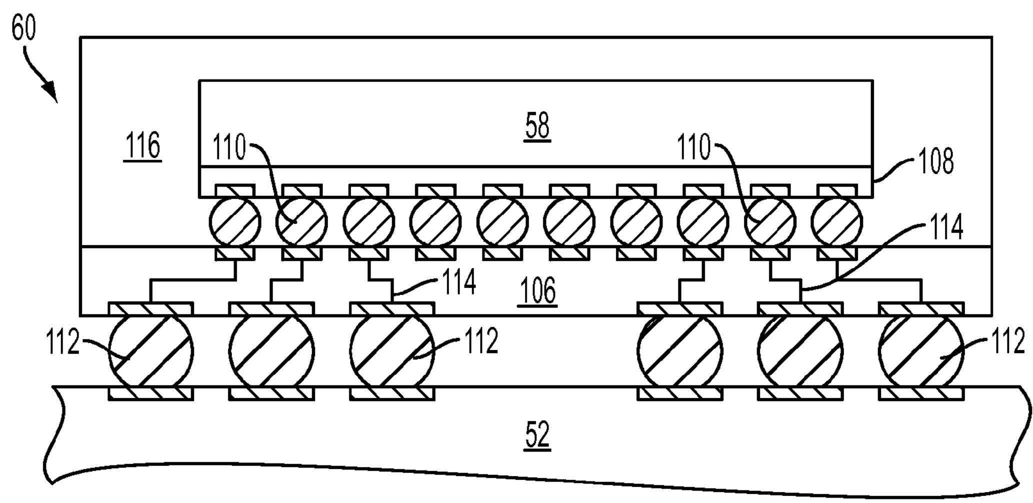

FIGS. 2*a*-2*c* show exemplary semiconductor packages. FIG. 2*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2*b* illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2*c*, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
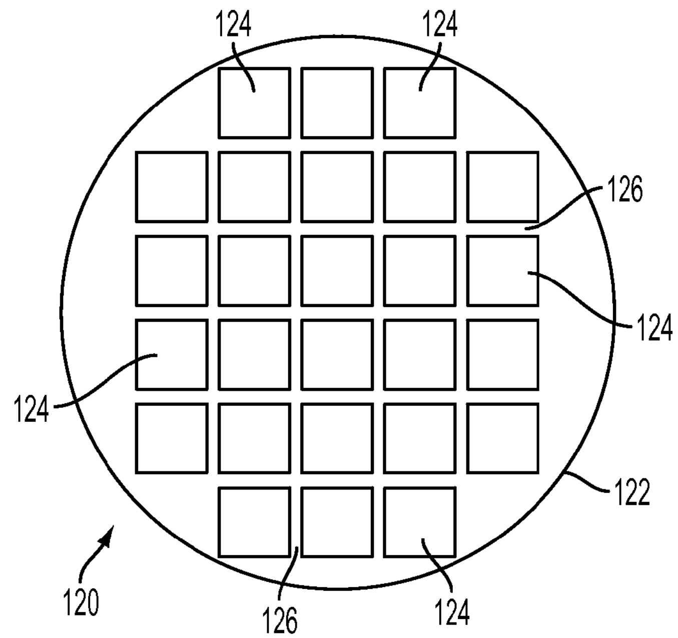
FIGS. 3*a*-3*c* illustrate a semiconductor wafer with a plurality of semiconductor die separated by a saw street.

FIG. 3*a* shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
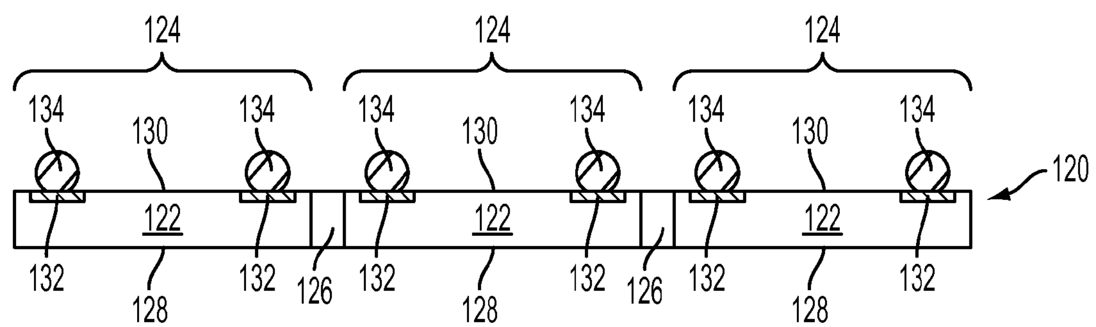

FIG. 3*b* shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3*b*. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded or thermocompression bonded to contact pads 132. Bumps 134 represent one type of interconnect structure that can be formed over contact pads 132. The interconnect structure can also use stud bump, micro bump, or other electrical interconnect.

Figure 3C:
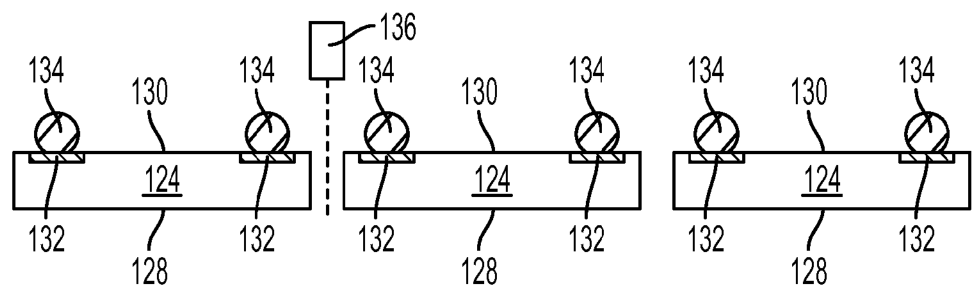

In FIG. 3*c*, semiconductor wafer 120 is singulated through saw street 126 using a saw blade or laser cutting tool 136 into individual semiconductor die 124.

Figure 4A:
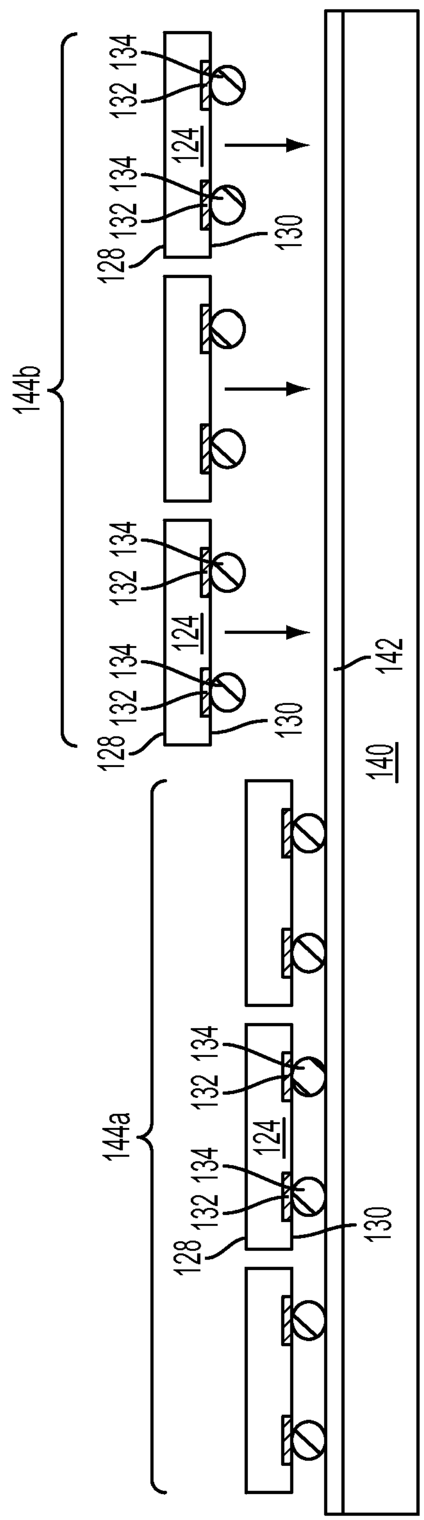
FIGS. 4*a*-4*h* illustrate a two-step individual die bonding for a short time and then multiple die thermal compression bonding to a carrier for a longer time.

FIGS. 4a-4h illustrate, in relation to FIGS. 1 and 2a-2c, a two-step process of individual die bonding for a short period of time and then simultaneous multiple die thermal compression bonding for a longer period of time. FIG. 4a shows a cross-sectional view of a portion of carrier or temporary substrate 140 containing sacrificial or reusable base material such as silicon, polymer, beryllium oxide, glass, or other suitable low-cost, rigid material for structural support. An interface layer or double-sided tape 142 is formed over carrier 140 as a temporary adhesive bonding film, etch-stop layer, or thermal release layer. In another embodiment, interface layer 142 can be a non-conductive paste (NCP) or non-conductive film (NCF) applied to carrier 140.

Figure 4B:
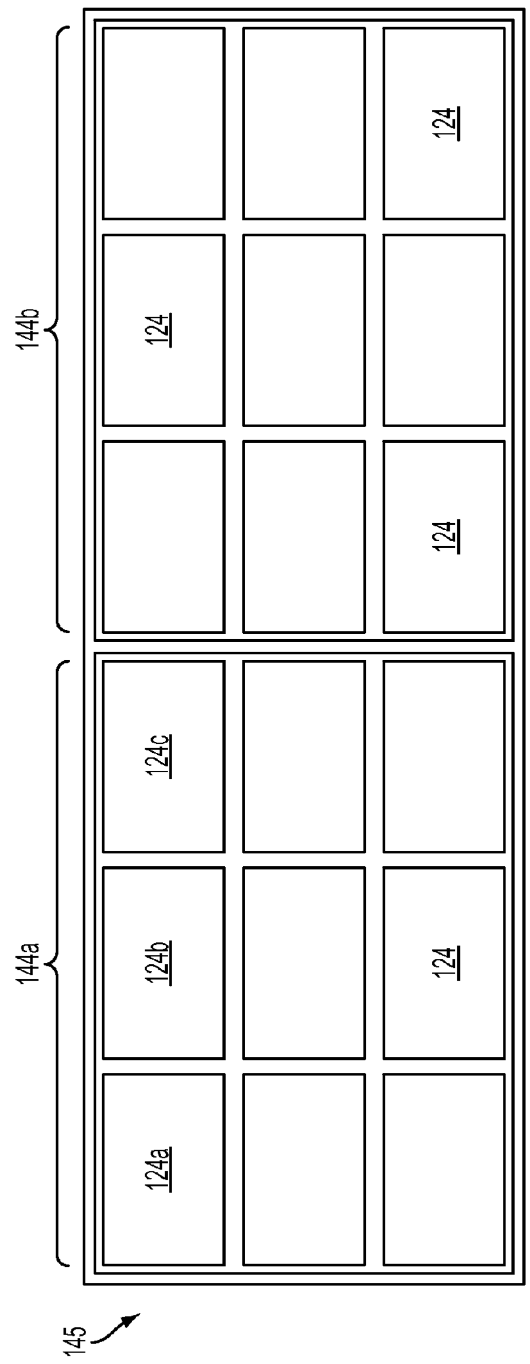

Semiconductor die 124 from FIG. 3c is mounted to carrier 140 and interface layer 142 using, for example, a pick and place operation with bumps 134 oriented toward the carrier. Carrier 140 has sufficient size to accommodate multiple semiconductor die 124 arranged in segments 144a and 144b. For example, a strip of semiconductor die 124 has an array of 3×3 die per segment and 2-4 segments per strip. FIG. 4b is a top view of strip 145 containing semiconductor die 124 mounted to carrier 140 with nine semiconductor die (3×3 array) in segment 144a and nine semiconductor die (3×3 array) in segment 144b.

Figure 4C:
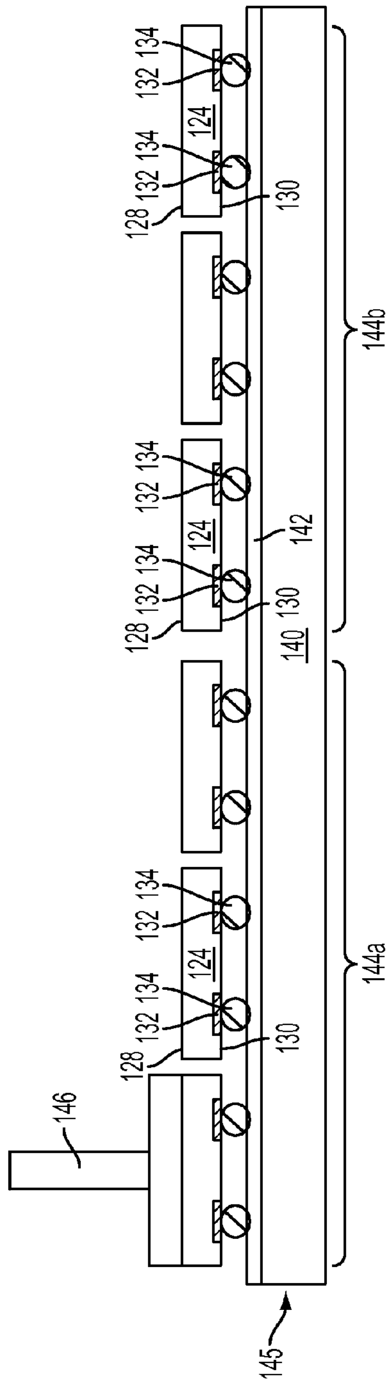

Semiconductor die 124 are bonded to carrier 140 and interface layer 142 to minimize or eliminate die shifting during subsequent encapsulation and formation of build-up interconnect structures. Accordingly, in a first bonding operation or step, each semiconductor die 124 on strip 145 is individually pressed towards carrier 140 using chuck head 146 against back surface 128 so that bumps 134 partially penetrate into interface layer 142 or NCP layer or NCF, as shown in FIG. 4c. In one embodiment, the pressure applied to back surface 128 of semiconductor die 124 by chuck head 146 is 10 newtons (N). The duration of first bonding step using chuck head 146 is 1 second or less for each semiconductor die 124. That is, chuck head 146 presses against back surface 128 of semiconductor die 124a for 1 second, then moves and presses against back surface 128 of semiconductor die 124b for 1 second, then moves and presses against back surface 128 of semiconductor die 124c for 1 second, and so on for each semiconductor die in segments 144a and 144b in strip 145. The first bonding step provides temporary positioning and adhesion of semiconductor die 124 to carrier 140 and interface layer 142.

Figure 4D:
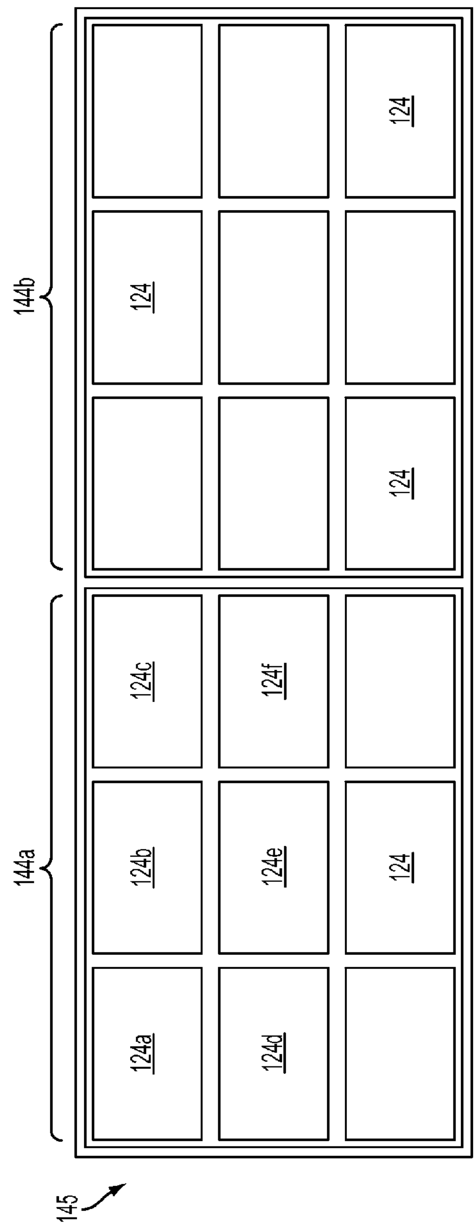
Figure 4E:
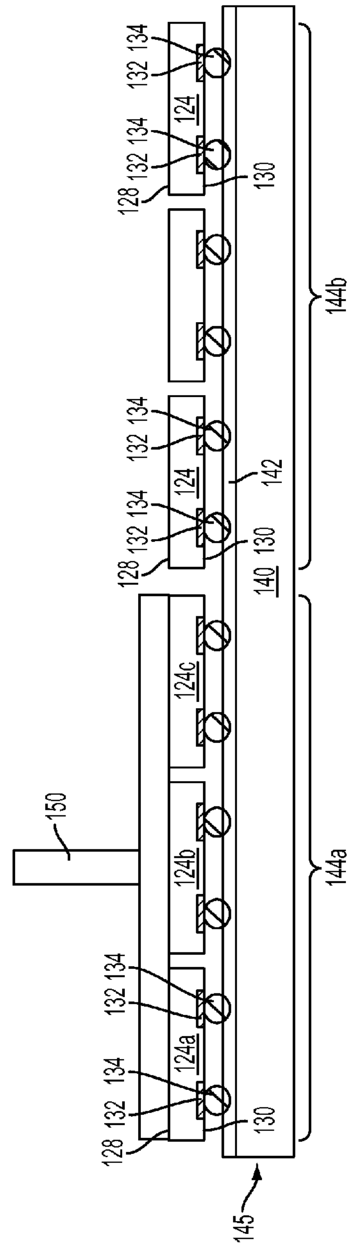

In a second bonding operation or step, multiple semiconductor die 124 are collectively and simultaneously pressed towards carrier 140 in groups using chuck head 150 under higher temperature and pressure, i.e., thermal compression bonding. FIG. 4d shows a top view of strip 145 containing semiconductor die 124 mounted to carrier 140 with nine semiconductor die (3×3 array) in segment 144a and nine semiconductor die (3×3 array) in segment 144b. In FIG. 4e, chuck head 150 simultaneously presses against back surface 128 of three semiconductor die 124a, 124b, 124c in one row of segment 144a for 5-10 seconds, then moves and simultaneously presses against back surfaces 128 of semiconductor die 124d, 124e, 124f in another row of segment 144a for 5-10 seconds, and so on for each group of die in segments 144a and 144b. In one embodiment, the bonding temperature is 250° C. and pressure applied to three semiconductor die 124 by chuck head 150 is 60N. The duration of the second bonding step using chuck head 150 is about 5-10 seconds for each group of semiconductor die 124 under the chuck head. The bonding force per die is controlled so that every unit receives a similar bonding force, e.g. about 20N or 3*20N=60N, at the same temperature and for the same period of time.

The grouping of semiconductor die 124 for the second thermal compression bonding step can be a row of die within one segment, column of die within one segment, multiple rows of die, multiple columns of die, all die in one segment, or die in multiple segments. By individually bonding each semiconductor die 124 under a lower pressure and for a short period of time (1 second) and then simultaneously thermal compression bonding multiple semiconductor die at higher temperature and pressure for a longer duration (5-10 seconds), the overall throughput of die bonding increases for more die per unit of time, i.e., greater UPH. For example, given a 5×5 millimeter (mm) die arranged in 3×3 die per segment and 4 segments per strip (36 die per strip), and further given 10N of pressure for 1 second duration for the individual bonding step and then 60N of pressure for 5 seconds duration for each group of three die in the thermal compression bonding step, the total die bonding cycle time is 120 seconds. The size of chuck head 150 accommodates three semiconductor die 124, e.g., 3 die in a row or column of the segment. The bonding cycle time is 10 seconds and yields an average cycle time per unit of 3.3 seconds and 1080 UPH.

In another example, given a 5×5 mm die arranged in 3×3 die per segment and 4 segments per strip (36 die per strip), and further given 10N of pressure for 1 second duration for the individual bonding step and then 180N of pressure for 5 seconds duration for each group of nine die in the thermal compression bonding step, the total die bonding cycle time is 40 seconds. The size of chuck head 150 accommodates nine semiconductor die 124, e.g., 3×3 array of die in the segment. The bonding cycle time is 10 seconds and yields an average cycle time per unit of 1.1 seconds and 3240 UPH. The individually bonding each semiconductor die 124 for a short period of time and then simultaneously thermal compression bonding multiple semiconductor die for a longer duration increases die throughput, i.e., 1080 UPH for 3 die group and 3240 UPH for 9 die group as compared to the 360 UPH described in the background.

The interface layer 142 or NCP layer or NCF is cured to secure semiconductor die 124 to carrier 140.

Figure 4F:
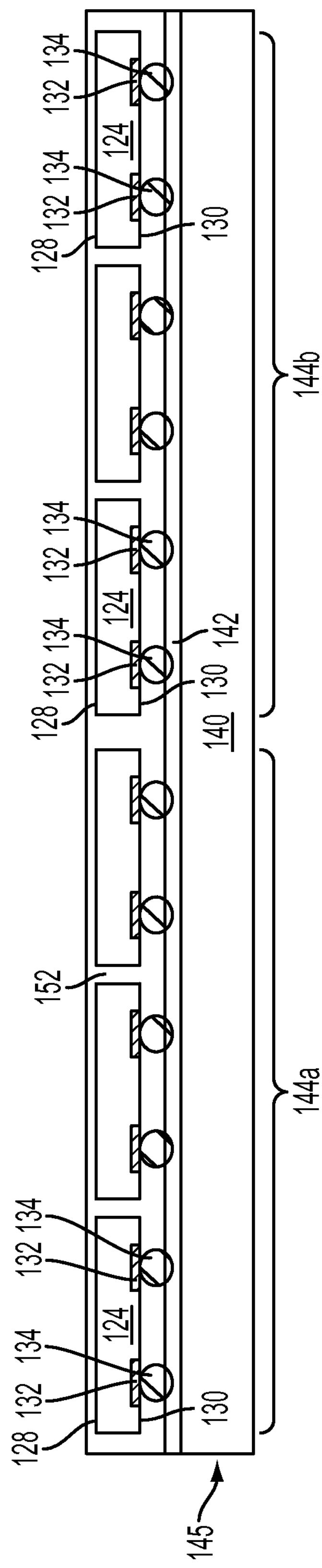

In FIG. 4f, an encapsulant or molding compound 152 is deposited over semiconductor die 124 using a paste printing, compressive molding, transfer molding, liquid encapsulant molding, vacuum lamination, spin coating, or other suitable applicator. Encapsulant 152 can be polymer composite material, such as epoxy resin with filler, epoxy acrylate with filler, or polymer with proper filler. Encapsulant 152 is non-conductive and environmentally protects the semiconductor device from external elements and contaminants. The two-step bonding process described above minimizes or eliminates die shifting during encapsulation.

Figure 4G:
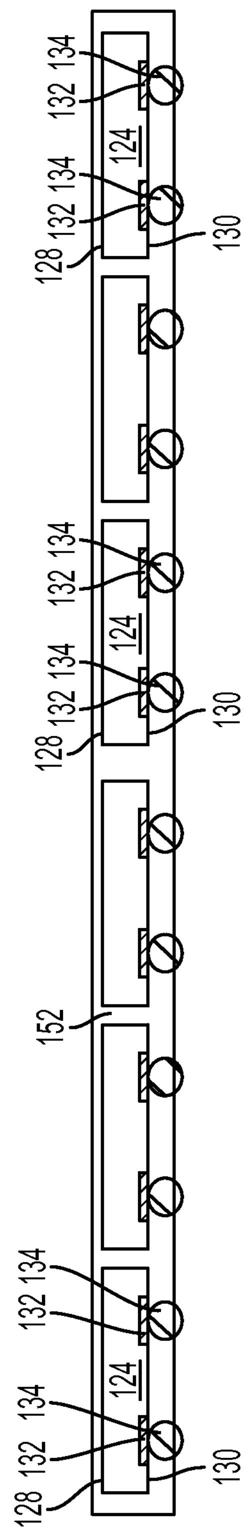

In FIG. 4g, carrier 140 and interface layer 142 are removed by chemical etching, mechanical peeling, chemical mechanical planarization (CMP), mechanical grinding, thermal release, UV light, laser scanning, or wet stripping to expose bumps 134.

Figure 4H:
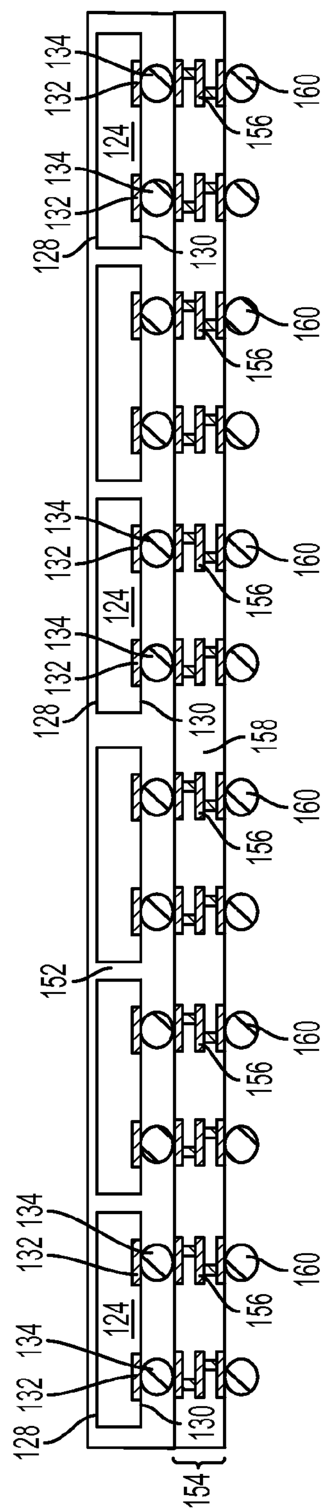

In FIG. 4h, a build-up interconnect structure 154 is formed over semiconductor die 124 and encapsulant 152. Build-up interconnect structure 154 includes an electrically conductive layer or redistribution layer (RDL) 156 formed using a patterning and metal deposition process such as sputtering, electrolytic plating, or electroless plating. Conductive layer 156 can be one or more layers of Al, Cu, Sn, Ni, Au, Ag, or other suitable electrically conductive material. One portion of conductive layer 156 is electrically connected to bumps 134. Other portions of conductive layer 156 can be electrically common or electrically isolated depending on the design and function of semiconductor die 124.

An insulating or passivation layer 158 is formed around and between conductive layers 156 using PVD, CVD, printing, lamination, spin coating, spray coating, sintering or thermal oxidation. The insulating layer 158 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties.

An electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form balls or bumps 160. In some applications, bumps 160 are reflowed a second time to improve electrical contact to conductive layer 156. In one embodiment, bumps 160 are formed over an under bump metallization (UBM) layer. The bumps can also be compression bonded or thermocompression bonded to conductive layer 156. Bumps 160 represent one type of interconnect structure that can be formed over conductive layer 156. The interconnect structure can also use bond wires, conductive paste, stud bump, micro bump, or other electrical interconnect.

Figure 5:
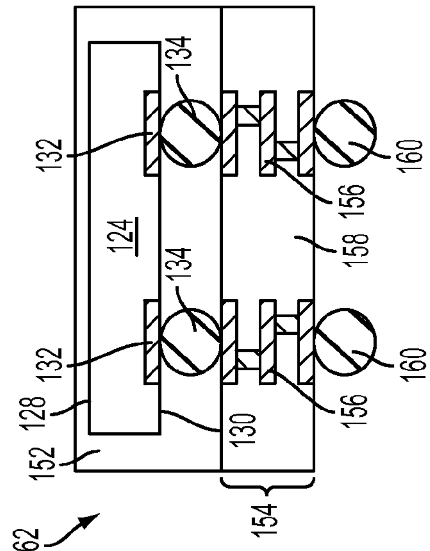
FIG. 5 illustrates a semiconductor package after encapsulation and formation of a build-up interconnect structure.

Strip 145 is singulated through encapsulant 152 and build-up interconnect structure 154 using a saw blade or laser cutting tool into individual semiconductor die 124. FIG. 5 shows semiconductor package 162 post singulation including semiconductor die 124 electrically connected through bumps 134 to conductive layer 156 in build-up interconnect structure 154. The two-step bonding process secures semiconductor die 124 to carrier 140 during encapsulation and formation of build-up interconnect structure to reduce or eliminate die shifting. By individually bonding each semiconductor die 124 under a lower pressure and for a short period of time (1 second) and then simultaneously thermal compression bonding multiple semiconductor die at higher temperature and pressure for a longer duration (5-10 seconds), the overall throughput of die bonding increases for more die per unit of time. The higher die throughput reduces costs by increasing UPH while achieving good joint reliability and minimizing or eliminating die shifting.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a carrier;

applying a non-conductive interface layer to the carrier;

providing a plurality of semiconductor dice including bumps;

temporarily mounting the plurality of semiconductor dice to the carrier and non-conductive interface layer by, (a) pressing the bumps of a first semiconductor die of the plurality of semiconductor dice at least partially into the non-conductive interface layer while holding at a first pressure and first temperature for a first time period one second or less, (b) pressing the bumps of a second semiconductor die of the plurality of semiconductor dice at least partially into the non-conductive interface layer while holding at the first pressure and the first temperature for the first time period, and (c) after steps (a) and (b), simultaneously thermal compression bonding the first semiconductor die and the second semiconductor die of the plurality of semiconductor dice to the non-conductive interface layer while holding at a second pressure and second temperature greater than the first pressure and first temperature for a second time period greater than the first time period;

depositing an encapsulant over the plurality of semiconductor dice and the non-conductive interface layer;

removing the non-conductive interface layer and carrier; and forming an interconnect structure over the plurality of semiconductor dice and encapsulant.

2. The method of claim 1, wherein the first time period is one second or less and the second time period is 5-10 seconds.

3. The method of claim 1, further including simultaneously thermal compression bonding a row of semiconductor dice to the non-conductive interface layer.

4. The method of claim 1, wherein the non-conductive interface layer includes non-conductive paste or non-conductive film.

5. The method of claim 1, wherein temporarily mounting the plurality of semiconductor dice reduces shifting of the plurality of semiconductor dice during depositing the encapsulant over the plurality of semiconductor dice.

6. A method of making a semiconductor device, comprising:

providing a carrier;

forming an interface layer over the carrier;

providing a plurality of semiconductor dice including bumps;

mounting the plurality of semiconductor dice to the interface layer by, (a) pressing the bumps of the plurality of semiconductor dice at least partially into the interface layer while holding at a first pressure and first temperature for a first period of time, and (b) simultaneously thermal compression bonding multiple semiconductor dice to the interface layer while holding at a second pressure and second temperature greater than the first pressure and first temperature for a second period of time longer than the first period of time; and removing the interface layer and carrier.

7. The method of claim 6, wherein the first period of time is one second or less.

8. The method of claim 6, wherein the second period of time is 5-10 seconds.

9. The method of claim 6, further including simultaneously thermal compression bonding a row of semiconductor dice to the carrier.

10. The method of claim 6, further including simultaneously thermal compression bonding multiple rows of semiconductor dice to the carrier.

11. The method of claim 6, further including depositing an encapsulant over the plurality of semiconductor dice.

12. The method of claim 6, further including forming an interconnect structure over the plurality semiconductor dice.

13. A method of making a semiconductor device, comprising:

providing a carrier;

forming a non-conductive interface layer over the carrier;

providing a plurality of semiconductor dice including a first interconnect structure;

mounting the plurality of semiconductor dice to the carrier and non-conductive interface layer by, (a) pressing the first interconnect structure of the plurality of semiconductor dice into the interface layer under a first pressure and first temperature for a first time period, and (b) simultaneously thermal compression bonding multiple semiconductor dice to the non-conductive interface layer and carrier under a second pressure and second temperature greater than the first pressure and first temperature for a second time period longer than the first time period; and removing the non-conductive interface layer and carrier.

14. The method of claim 13, wherein the first interconnect structure includes bumps further including individually pressing the plurality of semiconductor dice to the carrier prior to the thermal compression bonding.

15. The method of claim 14, wherein the first time period is one second or less.

16. The method of claim 13, wherein the second time period is 5-10 seconds.

17. The method of claim 13, further including simultaneously thermal compression bonding a row of semiconductor dice to the carrier.

18. The method of claim 13, further including depositing an encapsulant over the plurality of semiconductor dice.

19. The method of claim 13, further including forming a second interconnect structure over the plurality of semiconductor dice.

20. The method of claim 13, wherein the non-conductive interface layer includes non-conductive paste or non-conductive film.

21. A method of making a semiconductor device, comprising:

providing a carrier;

forming an interface layer over the carrier;

providing a plurality semiconductor dice including a first interconnect structure;

mounting the plurality semiconductor dice to the carrier and interface layer by, (a) pressing the plurality semiconductor dice into the interface layer under a first pressure and first temperature for a first time period, and (b) simultaneously thermal compression bonding multiple semiconductor dice to the carrier under a second pressure and second temperature greater than the first pressure and first temperature for a second time period longer than the first time period; and removing the interface layer and carrier.

22. The method of claim 21, wherein the first time period is one second or less and the second time period is 5-10 seconds.

23. The method of claim 21, further including:

curing the interface layer; and depositing an encapsulant over the plurality semiconductor dice.

24. The method of claim 21, further including forming a second interconnect structure over the plurality semiconductor dice and encapsulant after removing the interface layer.

25. The method of claim 21, further including forming an interconnect structure over the plurality semiconductor dice prior to mounting the plurality semiconductor dice.

26. The method of claim 25, wherein the interconnect structure includes bumps.

* * * * *